United States Patent [19]

Pampalone

[11] 4,263,385

[45] Apr. 21, 1981

[54] METHOD FOR THE MANUFACTURE OF MULTI-COLOR MICROLITHOGRAPHIC DISPLAYS

[75] Inventor: Thomas R. Pampalone, Belle Mead, N.J.

[73] Assignee: RCA Corporation, New York, N.Y.

[21] Appl. No.: 127,794

[22] Filed: Mar. 6, 1980

[51] Int. Cl.³ .............................................. B05D 3/06
[52] U.S. Cl. ................................. 430/25; 427/43.1; 427/54.1; 427/68; 430/28
[58] Field of Search .................. 430/26; 430/25, 26, 430/28, 253; 427/43.1, 54.1, 68, 56.1

[56] References Cited

U.S. PATENT DOCUMENTS

| | | | |
|---|---|---|---|
| 2,854,348 | 9/1958 | Bowerman . | |
| 3,260,612 | 7/1966 | Dulmage et al. | 430/253 |
| 3,446,184 | 5/1969 | Johnson . | |
| 3,544,350 | 12/1970 | Veirs . | |
| 3,577,258 | 8/1971 | Lange et al. | 427/68 |
| 3,981,729 | 9/1976 | Saulnier . | |
| 4,157,467 | 6/1979 | Peiffer | 427/54.1 |
| 4,207,102 | 6/1980 | Dessauer | 427/54.1 |

OTHER PUBLICATIONS

Marvel et al., "Journ. Am. Chem. Soc.", vol. 61, Oct. 1939, pp. 2710–2714.
Ryden et al., "Journ. Am. Chem. Soc.", vol. 58, Oct. 1936, pp. 2047–2050.

*Primary Examiner*—John H. Newsome
*Attorney, Agent, or Firm*—Birgit E. Morris; Edward J. Sites

[57] ABSTRACT

A method for the manufacture of multi-colored microlithographic displays especially fluorescent screens for cathode ray tubes is provided in which a film of a positive phototackifiable polyacetylene sulfone polymer is applied to the substrate of the display. The film is then exposed in predetermined areas with a sufficient amount of radiation to tackify the exposed areas. The exposed areas are then contacted with a pigment or phosphor which is desired to be applied to the exposed area and it selectively adheres to the exposed areas. The exposure and dusting are repeated for each application of different color pigments, toners or phosphors.

11 Claims, 2 Drawing Figures

METHOD FOR THE MANUFACTURE OF MULTI-COLOR MICROLITHOGRAPHIC DISPLAYS

This invention relates to a method for the manufacture of multi-color microlithographic displays. More particularly, this invention is concerned with a microlithographic method of applying to the viewing screen of a cathode ray tube several different color phosphors in discrete patterns and with repeats of the patterns in close registration with each other.

BACKGROUND OF THE INVENTION

Microlithography has become a widely utilized method for accurately reproducing predetermined images on selected substrates. In this process as taught by the prior art a photoresist is applied to the surface of a suitable substrate such as glass, paper, plastic, metal foil or the like. The coated substrate is then selectively exposed to radiation to cause the exposed portions to become either more soluble or less soluble depending on the type of resist employed. The photoresist is then developed in the known manner. If a negative resist is employed, that is a resist which becomes more insoluble as a result of exposure to radiation, and a suitable pigment or other similar material such as a phosphor is blended with the photoresist as applied using the above-described process, sharp half-tone reproduction can be produced. This method is currently used in half tone photolithographic printing and in the manufacture of monochromatic television picture tubes.

When it is desired to microlithographically produce multicolor images or patterns on a substrate, substantial additional problems in the reproduction process are encountered. The prior art processes require multiple applications of photoresists, one for each color pigment or color phosphor which is to be applied. This results in substantially increased cost and also introduces technical problems in aligning or registering each of the required images with the other images. These problems are encountered in all the prior art processes where multi-coatings of colors and multiple exposure to radiation are required, such as in color photolithographic printing. However, for the purpose of describing the invention, particular attention will be directed to the manufacture of multi-color fluorescent screens for cathode ray tubes. It will be appreciated that the same general procedures are readily employed with other products.

The cathode ray tube, or as it is more commonly known, the picture tube of a color television receiver, includes a glass faceplate on which there is formed the viewing screen. The viewing screen consists of groups of symmetrically placed lines or dots of phosphor powders which, when excited, emit different colors. A one line pattern or one dot pattern on the screen includes individual separate lines or dots of different color-emitting phosphors. Each line pattern or dot pattern generally consists of three separate lines or separate dots, respectively, of red, green and blue emitting phosphors which are the primary color phosphors used to produce colored images on the viewing screen of cathode ray tubes. A black material can also be used to provide a black matrix about the color phosphor areas. Typically, the number of separate areas which can be excited during a full scan of a cathode ray tube having a diagonal width of about 50 centimeters will be about 500,000 to 1,000,000 or even higher. As the number of separate discrete patterns of different colored phosphors which can be excited on the screen increase, the picture generally becomes brighter and the color reproduction of the image becomes more accurate.

When a cathode ray tube is fully assembled for use, for example in a color television receiver, a thin perforated metal plate called a shadow mask is placed a short distance from the screen. The shadow mask has a large number of critically spaced apertures which are in alignment with the phosphor areas on the screen. When the screen is scanned with an aimed electron beam, only selected colored phosphor areas on the screen are excited. The scanning of the screen of the cathode ray tube with an appropriate number of signal carrying electron beams causes certain selected phosphor areas to be excited and emit colors and this results in the production of a colored image on the screen of the cathode ray tube.

Various problems are encountered in the manufacture of multi-color cathode ray tubes. The discrete line or dot patterns, which are formed on conventional cathode ray tubes, are already numerous and the trend is to attempt to even more closely pack a larger number of patterns of the different color-emitting phosphors on the screen. To obtain the desired improvement in quality the phosphors must be applied in close proximity to each other and must also be present in the discrete areas in exact registration with each other and with adjacent repeats of the pattern. The different color-emitting phosphors cannot overlap each other, that is contaminate each other, as this destroys the color fidelity of the picture produced on the screen.

The technical problems which are encountered in the manufacture of cathode ray tubes are numerous and these are further complicated by commercial considerations. It is essential that any commercial process for the formation of the screens must be relatively low in cost per unit so as to make large scale production feasible. The required low-cost, mass-production methods must also result in a high quality and extreme uniformity without requiring extremely rigid process controls or highly critical and sensitive production procedures.

Various methods have been suggested in the prior art for applying the phosphors to the screens of the cathode ray tubes. One such method is disclosed in Bowerman, U.S. Pat. No. 2,854,348, wherein the surface screen is printed with a tacky material and then the surface is dusted with a suitable powdered phosphor. The printing process and the dusting process are repeated for each application of a different phosphor. The patterns which are printed on the screen of the tube must be accurately aligned with each other to prevent overlap of different phosphors and also to provide the proper registration. The printing process has proven to be inherently unsatisfactory because of the physical limitations of printing processes to produce micro-fine separations and accurate spacing of the different colored phosphor areas.

Various methods are used in accordance with the prior art which employ negative photobinders and selective radiation exposure. A negative photobinder is a material which, on exposure to radiation such as ultraviolet light, becomes relatively insoluble and nonadhesive in comparison to unexposed portions. Some conventional negative photobinders which are used in the manufacture of cathode ray tubes are chromate-sensitized casein and chromate-sensitized vinyl alcohol polymers.

The negative photobinder is applied to the faceplate of the cathode ray tube and then the entire area of the faceplate is exposed with the exception of those areas where it is desired to apply the phosphor. The exposed portions become nonadhesive and relatively insoluble. Then, by applying a suitable solvent, the unexposed areas can be made relatively tacky. The relatively tacky areas are then dusted with a phosphor which selectively sticks to the unexposed areas. When applying a number of different colored phosphors utilizing the above prior art technique, it is necessary to apply a new coating of the photobinder for each color phosphor which is applied.

An alternate method which has been suggested in the prior art is to apply a mixture of a negative photobinder such as those identified above and the particular type of phosphor desired to be applied to the surface of the screen either as a slurry or as a dry powdered mixture in a manner to adhere it uniformly to the screen. Using this technique, the photobinder is exposed through a shadow mask in those areas wherein it is desired to adhere the phosphors to the screen. The exposure to radiation causes the exposed areas of the photobinder to become relatively insoluble. Thereafter, the entire surface of the photobinder is developed to remove the unexposed materials. The coating procedure, the exposure and the development are repeated for the application of each type of phosphor. Such a process is disclosed by Veirs, U.S. Pat. No. 3,544,350. There are various modifications of the above processes, such as those disclosed in Lange et al., U.S. Pat. No. 3,597,258 and Saulnier, U.S. Pat. No. 3,981,729.

The prior art methods have the common problem of requiring multiple application of binder. In addition, certain of the processes require development steps between each application of phosphors as well as other similar intermediate steps such as drying and conditioning.

The production costs are increased because of the multiple steps. In addition, the chances for error in placement and cross-contamination of the phosphors is likewise significantly increased because of the multiple steps.

It would be highly advantageous if a microlithographic method could be provided for the manufacture of multi-colored products such as colored cathode ray tubes, multi-color photolithographic prints and the like which would involve fewer process steps and which provided improved accuracy of reproduction.

SUMMARY OF THE INVENTION

A method for the manufacture of multi-colored products such as fluorescent screens for colored cathode ray tubes is provided. A film of a positive phototackifiable polymeric binder is applied to the substrate on which the image or pattern is to be formed. The film is then exposed in predetermined areas wherein it is desired to deposit a given pigment or phosphor with a sufficient amount of radiation to convert the exposed areas of the polymeric binder from a nonadhesive state to a highly tacky state. The exposed film is then contacted with the particular pigment or phosphor which is desired to be applied. The pigment or phosphor selectively adheres to the exposed portions of the polymeric binder. The exposure and contact by the material desired to be applied is repeated for each application of pigment or phosphor.

DETAILED DESCRIPTION OF THE INVENTION

Figure 1:
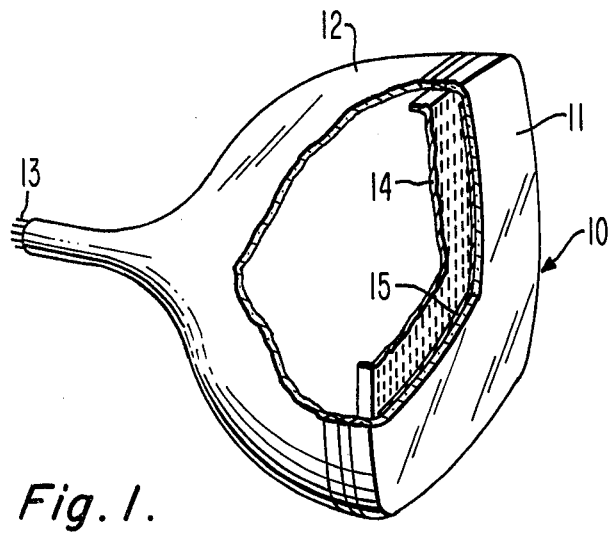
FIG. 1 is a perspective illustration with parts broken away of a cathode ray tube.

Referring to the drawing, in FIG. 1 there is shown a typical cathode ray tube 10. The cathode ray tube 10 is comprised of a faceplate 11 and a funnel portion 12, each of which is made of glass. Inside the cathode ray tube 10 there is an electron gun 13 which is aimed at a shadow mask 14 which is positioned adjacent to the faceplate 11. On the inner surface of the faceplate 11 there is a screen 15 which is comprised of various colored phosphors. When electrons are emitted from the electron gun 13 and pass through the shadow mask 14 and contact the screen 15, the phosphors on the screen 15 are excited and an image is produced on the faceplate 11.

Figure 2:
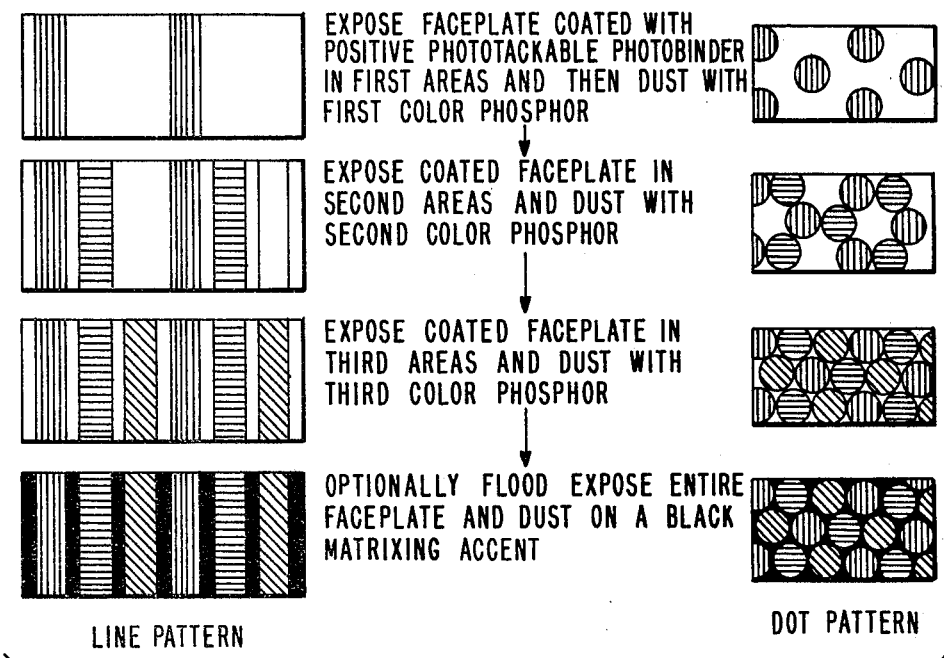
FIG. 2 is a flow diagram with accompanying illustration showing the method to produce multi-color screen with dot or line patterns.

As illustrated in FIG. 2, in accordance with this invention the screen 15 is formed on the inner surface of the faceplate in a series of steps. The faceplate 11 is coated with a phototackifiable polymeric binder. The coating is then exposed in discrete areas and a color phosphor is applied. The process is repeated until all the desired color phosphors are applied. The areas which are exposed sequentially can be in a series of lines or groupings of dots or any other arrangement which will provide the desired positioning and registration of color phosphors to each other.

The polymers which are preferrably employed as the phototackifiable polymeric binder are polyacetylene sulfones having repeating units in the backbone which are represented by the formula

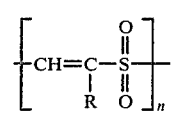

Formula I wherein R is hydrogen or an organic radical.

This general class of polymers is known and has been reported in the literature. The polymers have been described, for example, by L. L. Ryden and C. S. Marvel in 1936 in the Journal of American Chemical Society, volume 58, pages 2047–2050. This class of polymers has also been disclosed by Applicant of this invention in a copending application for use as a photoresist.

The acetylene sulfone polymeric binders which are employed derive their usefulness because of the relative instability upon exposure to radiation of the sulfur-vinyl bond in the polymer backbone. It has been found that this bond is especially sensitive to deep ultraviolet radiation without ultraviolet sensitizers or the like. The acetylene sulfone polymers are further especially useful in the method of this invention because the polymers upon exposure to radiation become tacky.

The preferred polyacetylene sulfones for use in this invention are polymers of Formula I wherein the radical R is a hydrogen, or an alkyl, alicyclic, aryl, aralkyl, or heterocyclic organic radical. The number of carbons in the organic radical R is not particularly critical provided it is not so excessively large as to adversely interfere with the radiation sensitivity of the polymer. Polyacetylene sulfone compounds wherein the group R is straight-chained or branch-chained alkyls having 1-12 carbon atoms or an alicyclic, aryl, aralkyl radical having up to 20 carbon atoms are particularly suitable. The preferred class of polyacetylene sulfone polymers from both the ease of preparation and the reactivity on exposure to radiation are those in which R and alkyl group having 1-12 carbon atoms, since the shorter side chain enhances the relative instability of the polymer on exposure to radiation. Some typical examples of polymers which have been found to be useful in this invention are poly (1-hexyne sulfone), poly (1-heptyne sulfone) and poly (1-pentyne sulfone).

The molecular weight of the acetylene sulfone polymer which is used as the tackifiable polymeric binder should also be sufficiently high as applied that the polymer in the unexposed state is not adhesive but after exposure becomes tacky. The requirements for the molecular weight will vary to some extent depending upon the type of group which is employed as the R substituent. However, in general, a molecular weight of about 50,000 to 500,000 or even higher is satisfactory for the purposes of this invention. The polyacetylene sulfone binders can be prepared by free radical polymerization of the acetylene monomer and sulfur dioxide. The molecular weight of the final polymer may be controlled by the amount of polymerization initiator added to the reaction mixture or by addition of water to the reaction mixture. Increasing the amount of the initiator causes a more predictable, controlled decrease in the molecular weight than the addition of water.

To apply the polymeric binder to the support for the screen such as the faceplate of a cathode ray tube, the polymeric binder is preferably initially dissolved in a solvent. Films of the polymeric binder are then cast, spun coated, sprayed, or the like onto the surface of the support for the screen. The solution of the binder containing between about 1 and 20% by weight of the polymer is satisfactory. Suitable solvents should have boiling points which are below the decomposition points of the polymeric binder to permit removal of the solvent from the films stored on the support by heating or by vacuum drying. Examples of suitable solvents for the polyacetylene sulfone polymers are acetone and cyclohexanone.

The film is cast on the screen support in thicknesses from about 50 angstroms to 10 microns. It is preferable to bake the film of the polymeric binder in air or vacuum at a temperature usually above the glass transition temperature of the polymeric binder but below its thermal decomposition temperature. The baking removes traces of solvent and anneals out stresses and strains in the film.

The screen is selectively exposed to radiation to those areas wherein it is desired to deposit a phosphor. The radiation which is employed to expose the film can be ultraviolet radiation, an electron beam, x-ray radiation, gamma radiation and the like. The acetylene sulfone polymeric binders of this invention are especially useful when exposed with ultraviolet radiation. The acetylene sulfone polymeric binders exhibit extremely good sensitivity to deep ultraviolet radiation having a wavelength from about 200 to 300 nanometers. The sensitivity of the polymeric binders to the deep ultraviolet radiation provides a number of significant advantages. Exposure with deep ultraviolet radiation makes it possible to obtain extremely fine resolution approaching that of electron beam exposure. The phosphors can then be deposited in extremely accurate patterns in very close registration with adjacent repeats of the pattern.

The exposure can be conducted in the conventional manner heretofore utilized in the prior art. For example, the exposure can be made through the aperture of a grid which simulates the shadow mask which will be used in the final assembled cathode ray tube. The exposure can be made using a lighthouse exposure apparatus of known construction. In order to obtain the maximum benefits of this invention, the exposure is made with deep ultraviolet light through a mask having even more apertures than are conventionally employed. When the final screen is assembled with a shadow mask having corresponding increases in apertures there is an increase in both the relative number of phosphor sites which can be activated and an improvement accuracy in the location and purity of the phosphors.

The film of the polymeric binder is given a separate exposure in predetermined areas for each of the phosphors which is applied. The unexposed areas of the polymeric binder remain nonadhesive and the powdered phosphors do not adhere to these areas. When the film of the polymeric binder is, however, selectively exposed in certain areas, the exposed areas undergo a degradation in the molecular weight and become very tacky.

The screen with the film of polymeric binder applied is then dusted with a specific type of phosphor. A separate type of phosphor is applied for each color. The specific type of phosphor and a particular size of the particles and order of application do not in and of themselves form a part of this invention apart from their use in this process.

The apparatus heretofore used for applying powders to the screens treated with negative photoresists can also be employed for use in the present invention. The powder is generally applied in a low pressure air stream directed at the screen. It is also possible to apply phosphors by contacting the surface with a powdered phosphor-coated substrate or by other methods.

The amount of particular powdered phosphors applied is dependent upon the particular phosphors utilized and the powder holding capacity of the tackified polymeric binder. It has been found the polyacetylene sulfone polymers when exposed with a sufficient amount of deep ultraviolet radiation to obtain the maximum tackification of the polymer will hold at least two milligrams of phosphor per square centimeter of exposed area with adhered amounts of phosphors of up to 7 milligrams per square centimeter being readily obtained. If the amount of phosphors desired to be applied to a unit area is less than the amount required to fully block the tackified exposed areas of the polymer, inert materials can be added to the phosphors. After each dusting of the phosphors the screen is preferably vacuumed to remove any unadhered phosphorous particles.

The screen is then exposed again in the same manner as above in other areas wherein it is desired to apply the second phosphor and the dusting procedure noted above is repeated. The same procedure is also followed for the application of the third phosphor and any subsequent treatments.

An advantage of the present invention is that the areas of the different phosphors are accurately located on the screen. A further significant advantage is that after each of the colored phosphors is applied, it is then possible using the positive phototackifiable polymeric binders of this invention to then flood expose the entire screen and then dust the screen with a black matrixing material which will adhere to those areas wherein the phosphors are not adhered. This provides the advantage of providing a black matrix around the colored phosphor area which results in improved performance of the television screen.

After the application of the phosphors is completed, and any subsequent treatments such as applying the black matrixing color are also completed, the screen is then treated in the conventional manner. The entire area of the screen is then coated with an organic binder for the purpose of temporarily holding all of the phosphors in place on the screen. Then, in the conventional manner an aluminizing coating is applied over the entire structure. Thereafter the screen is baked at a sufficiently high temperature to cause the photobinder and organic binder coat to thermally degrade and be removed from the screen.

The advantage obtained using the process of this invention is that with the use of a positive phototackifiable binder, only application of the binder is required to be applied to the screen to adhere all of the different colored phosphors to the screen as well as any black matrixing or the like. A further advantage is that a wider selection of phosphors can be employed in this process in that the water soluble or solvent soluble phosphors having otherwise exceptional properties can be used in this process unlike certain of the prior art processes. In addition, there is no need for development steps between each application of binder. A more significant advantage is that the use of the polyacetylene sulfone polymers as the polymeric binder makes it possible to use deep ultraviolet radiation to expose the binder material. This makes it possible to produce a multi-color cathode ray screen having substantially improved color reproduction properties. The use of the deep ultraviolet exposure technique with the polyacetylene sulfone binders results in the exposure having greater resolution and the subsequent application of the phosphors being more accurate with improved accuracy of location of the individual colored phosphors to each other and improved registration of repeats of the phosphors.

Although a sensitizer is not required for deep ultraviolet exposures, a sensitizer addition can be added to render these phototackifiable polymers sensitive to even longer wavelength radiation.

The present invention has been specifically described with reference to the manufacture of color cathode ray tubes. However, as noted above it is also useful in related fields such as microlithographic printing where pigments or toners rather than phosphors are employed. A further use is in textiles for printing of multi-color flock patterns and the like.

What is claimed is:

1. In a method for the manufacture of a multi-color image on a substrate, the improvement which consists essentially of:
   (a) coating the surface of the substrate with a film of a positive phototackifiable polyacetylene sulfone polymer having a repeating unit of the formula

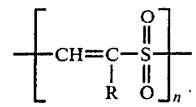

wherein R is a member selected from the group consisting of hydrogen and an organic radical;
   (b) exposing a predetermined first area of the film with radiation in an amount sufficient to tackify the exposed first area;
   (c) applying to the surface of the film a first color material whereby the first material selectively adheres to the first area;
   (d) exposing a predetermined second area of the film with radiation in an amount sufficient to tackify the exposed second area;
   (e) applying to the surface of the film a second color material whereby the second phosphor selectively adheres to the second area.

2. The method according to claim 1 wherein R is an organic radical selected from the group consisting of alkyl, cyclic alkyl, aryl, aralkyl and heterocyclic.

3. The method according to claim 2 wherein R has up to 20 carbon atoms.

4. The method according to claim 3 wherein R is a member selected from the group consisting of hydrogen and alkyl having 1–12 carbon atoms.

5. The method according to claim 1 wherein the exposure is conducted with ultraviolet radiation having a wavelength from about 200 to 300 nanometers.

6. The method according to claim 1 comprising the further steps of exposing a predetermined third area of the film with radiation in an amount sufficient to tackify the exposed third area and then apply a third color material which selectively adheres to the third area.

7. A method according to claim 1 wherein the substrate is the faceplate of a cathode ray tube.

8. The method according to claim 7 wherein the color materials are color emitting phosphors.

9. The method according to claim 8 wherein the faceplate is sequentially exposed and then contacted with color phosphor for at least three cycles.

10. The method according to claim 9 wherein after each exposure the faceplate is dusted with different color phosphors with said phosphors being blue, green, and red color emitting phosphors.

11. The method according to claim 10 wherein after sequentially exposing and sequentially applying the color phosphors the screen is exposed overall and dusted with a black matrixing material whereby a black matrix is formed about the areas having color phosphors adhered thereto.